United States Patent [19]

Parker

[11] Patent Number: 5,556,300
[45] Date of Patent: Sep. 17, 1996

[54] END CONNECTION FOR A FLEXIBLE SHIELDED CABLE CONDUCTOR

[75] Inventor: Stephen M. Parker, High Point, N.C.

[73] Assignee: The Whitaker Corporation, Wilmington, Del.

[21] Appl. No.: 338,931

[22] Filed: Nov. 14, 1994

[51] Int. Cl.$^6$ .................................................. H01R 9/07
[52] U.S. Cl. ........................................................ 439/497
[58] Field of Search .............................. 439/67, 493, 495, 439/497

[56] References Cited

U.S. PATENT DOCUMENTS

| | | | |
|---|---|---|---|
| 3,547,718 | 12/1970 | Gordon | 156/55 |
| 3,763,306 | 10/1973 | Marshall | 174/115 |
| 3,876,964 | 4/1975 | Balaster et al. | 333/84 M |
| 4,149,026 | 4/1979 | Fritz et al. | 174/32 |
| 4,172,626 | 10/1979 | Olsson | 439/67 |
| 4,287,385 | 9/1981 | Dombrowsky | 174/36 |
| 4,490,574 | 12/1984 | Tomita et al. | 174/36 |
| 4,538,024 | 8/1985 | Wise et al. | 174/117 F |
| 4,588,852 | 5/1986 | Fetterolf et al. | 174/36 |
| 4,644,092 | 2/1987 | Gentry | 174/36 |
| 4,663,098 | 5/1987 | Gilliam et al. | 264/104 |
| 4,680,423 | 7/1987 | Bennet et al. | 174/36 |
| 4,714,435 | 12/1987 | Stipanuk et al. | 439/326 |
| 4,719,319 | 1/1988 | Tighe, Jr. | 174/103 |
| 4,829,432 | 5/1989 | Hershberger et al. | 361/424 |
| 4,887,187 | 12/1989 | Nickola | 361/369 |
| 4,894,753 | 1/1990 | Wadell et al. | 361/424 |
| 4,926,007 | 5/1990 | Aufderheide et al. | 174/36 |
| 4,952,020 | 8/1990 | Huber | 350/96.23 |
| 4,967,315 | 10/1990 | Schelhorn | 361/424 |
| 4,967,316 | 10/1990 | Goebel et al. | 361/424 |
| 5,003,126 | 3/1991 | Fuji et al. | 174/36 |
| 5,028,742 | 7/1991 | Redman | 174/88 R |
| 5,051,098 | 9/1991 | Auclair et al. | 439/99 |
| 5,051,544 | 9/1991 | Harris | 174/117 F |
| 5,053,583 | 10/1991 | Miller et al. | 174/36 |
| 5,389,741 | 2/1995 | Ueno | 174/117 F |
| 5,414,220 | 5/1995 | Hanato | 439/77 |
| 5,416,268 | 5/1995 | Ellis | 174/36 |

*Primary Examiner*—Neil Abrams

[57] ABSTRACT

A connection (1) on an end of an electrical cable, comprises, a flexible and flat conductive shield (7), a flexible ribbon of insulation (3) separating the shield (7) from multiple flexible signal conductors (2) extending along the insulation (3), at least one flexible ground conductor (6) between the insulation (3) and the shield (7), and the signal conductors (2) and each said ground conductor (6) projecting beyond an end of the insulation (3) and being laminated to a stiffener (11), for use as an electrical connector for being received in a mating connector.

11 Claims, 6 Drawing Sheets

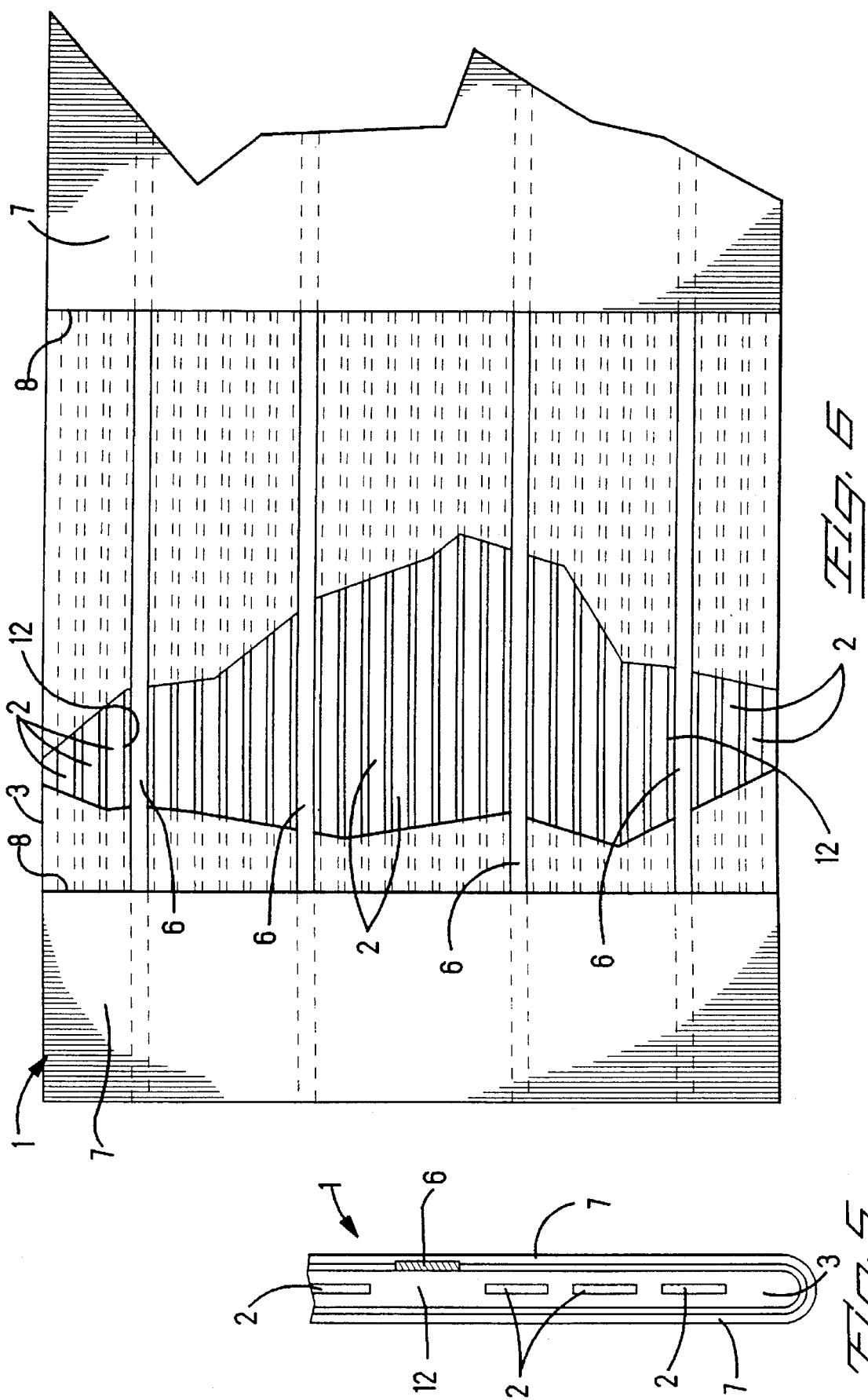

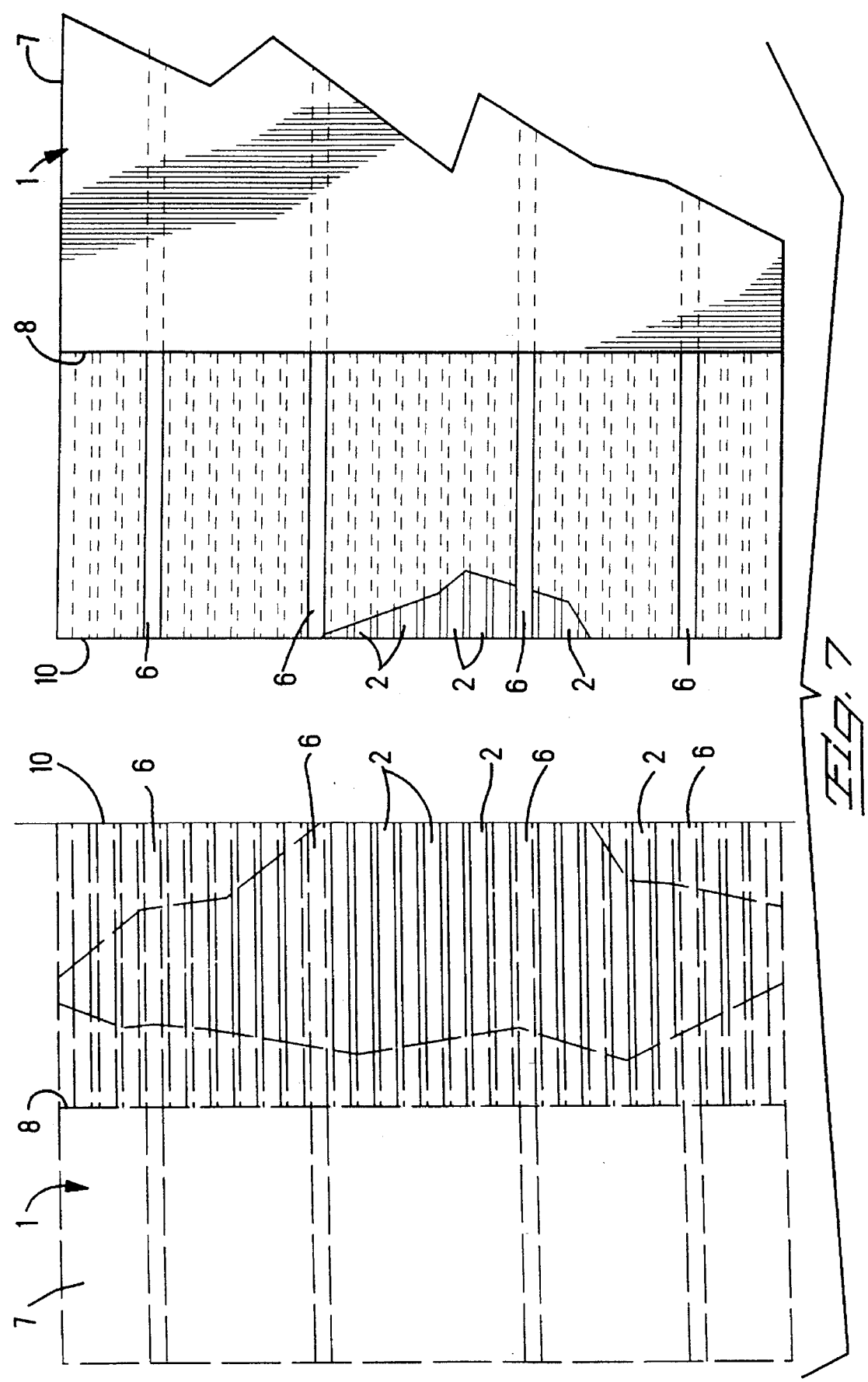

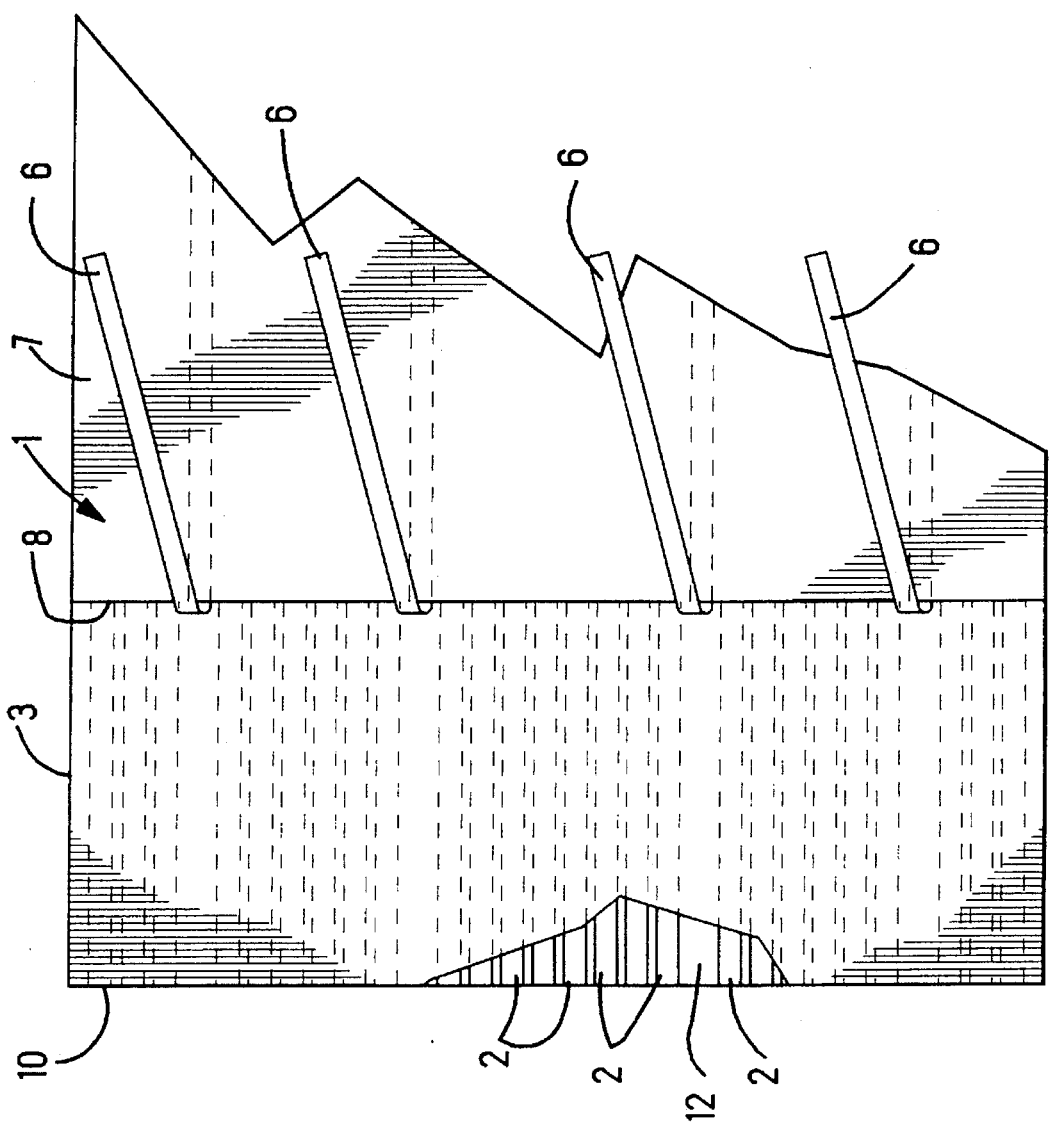
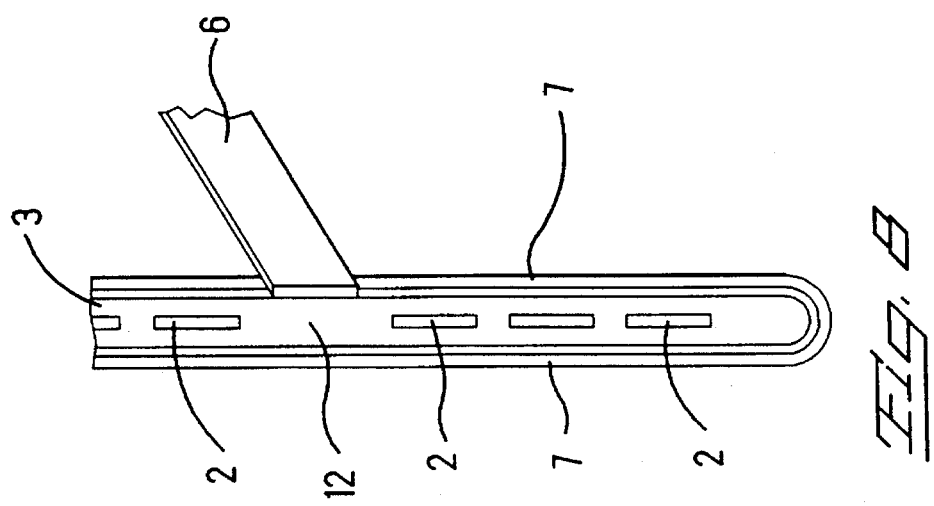

5,556,300

END CONNECTION FOR A FLEXIBLE SHIELDED CABLE CONDUCTOR

FIELD OF THE INVENTION

The invention relates to a flexible flat electrical cable, and, more particularly to a flexible flat electrical cable with a conductive shield.

BACKGROUND OF THE INVENTION

A jumper connection on the end of a flexible flat electrical cable is known from U.S. Pat. No. 4,172,626. The cable has exposed and bared conductors that are frictionally engaged by respective electrical terminals, and a stiffener holds the cable while the conductors of the cable are engaged against the terminals.

A flexible flat electrical cable comprises, multiple electrical conductors that extend along a continuous ribbon. The cross sections of the conductors can be round or flat, according to U.S. Pat. No. 4,287,385, and U.S. Pat. No. 4,149,026. According to U.S. Pat. No. 4,455,818, the conductors can be twisted together. According to U.S. Pat. No. 5,051,544, both the signal conductors and the ground conductors extend side by side in the same plane. A short piece of insulation is inserted in the cable. The signal conductors pass under the short piece of insulation. The ground conductors extend over the short piece of insulation. The short piece of insulation elevates the ground conductors from the remainder of the cable to improve access to the ground conductors.

SUMMARY OF THE INVENTION

According to an aspect of the invention, a connection comprises, a flexible and flat conductive shield, a flexible ribbon of insulation separating the shield from multiple flexible signal conductors extending along the insulation, and at least one flexible ground conductor between the insulation and the shield, the signal conductors are spaced apart on pitch spacings, with a signal conductor absent from at least one of the pitch spacings, said ground conductor extending above said one of the pitch spacings, and the signal conductors and each said ground conductor extending to a common plane beyond said end of the insulation for termination by electrical terminals.

According to an embodiment of the invention, at least one opening through the shield exposes the insulation and each said ground conductor. The opening provides a location for severing the ground conductors and bending the ground conductors away from a remainder of the cable. The remainder of the cable is exposed at the opening, and can be severed at the opening for access to the signal conductors.

According to an embodiment of the invention, a stiffener supports the signal conductors and the ground conductors.

DESCRIPTION OF THE DRAWINGS

An embodiment of the invention will now be described with reference to the accompanying drawings, according to which:

FIG. 5 is a section view of a portion of the connection shown in FIG. 6;

FIG. 6 is a fragmentary top view of a portion of the connection shown in FIG. 1 prior to being cut to length, and shown with parts cut away;

FIG. 7 is a top view of a portion of the connection shown in FIG. 6, with a portion of the connection being severed;

FIG. 8 is an end view of a portion of a connection shown in FIG. 9;

FIG. 9 is a top view of a portion of a connection with parts cut away;

DESCRIPTION

Figure 1:
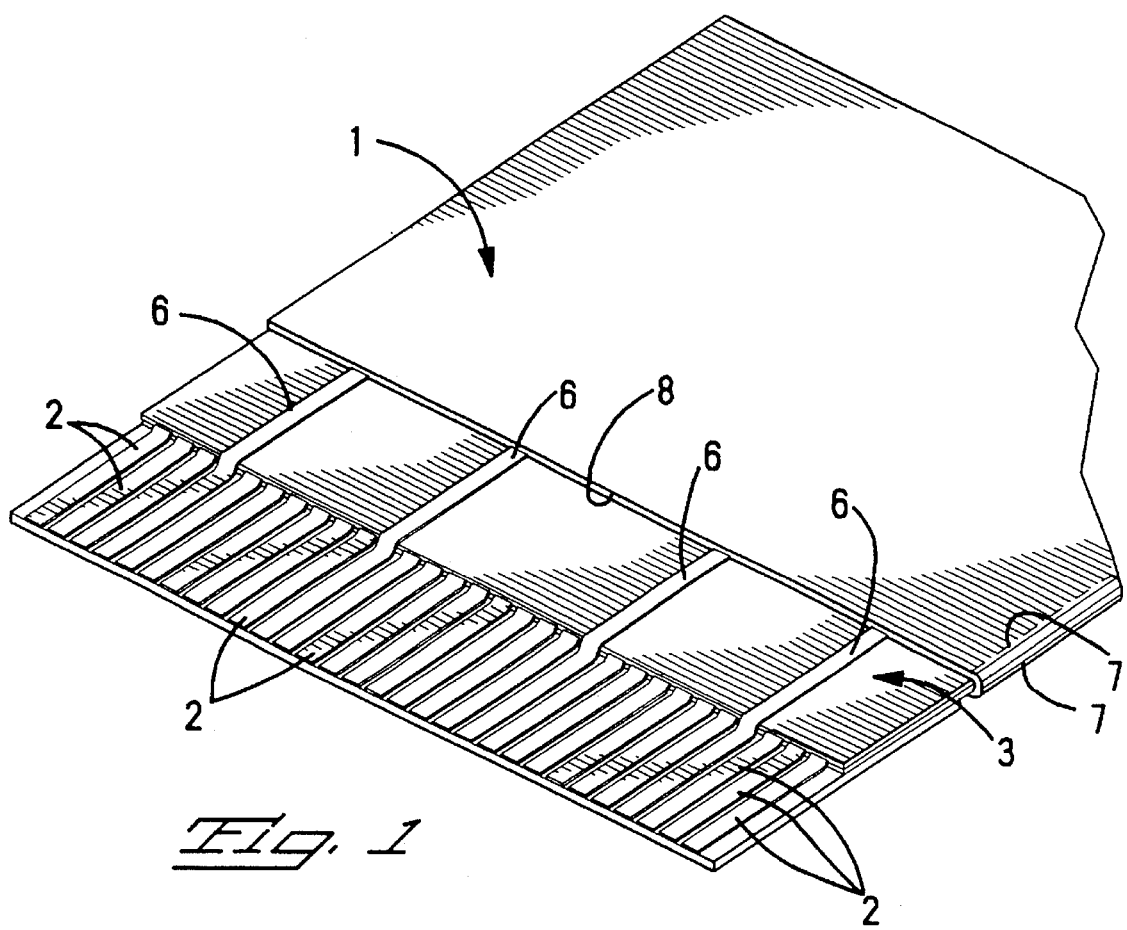
FIG. 1 is a fragmentary perspective view of a connection on an electrical cable, cut to length and ready for termination.
Figure 2:
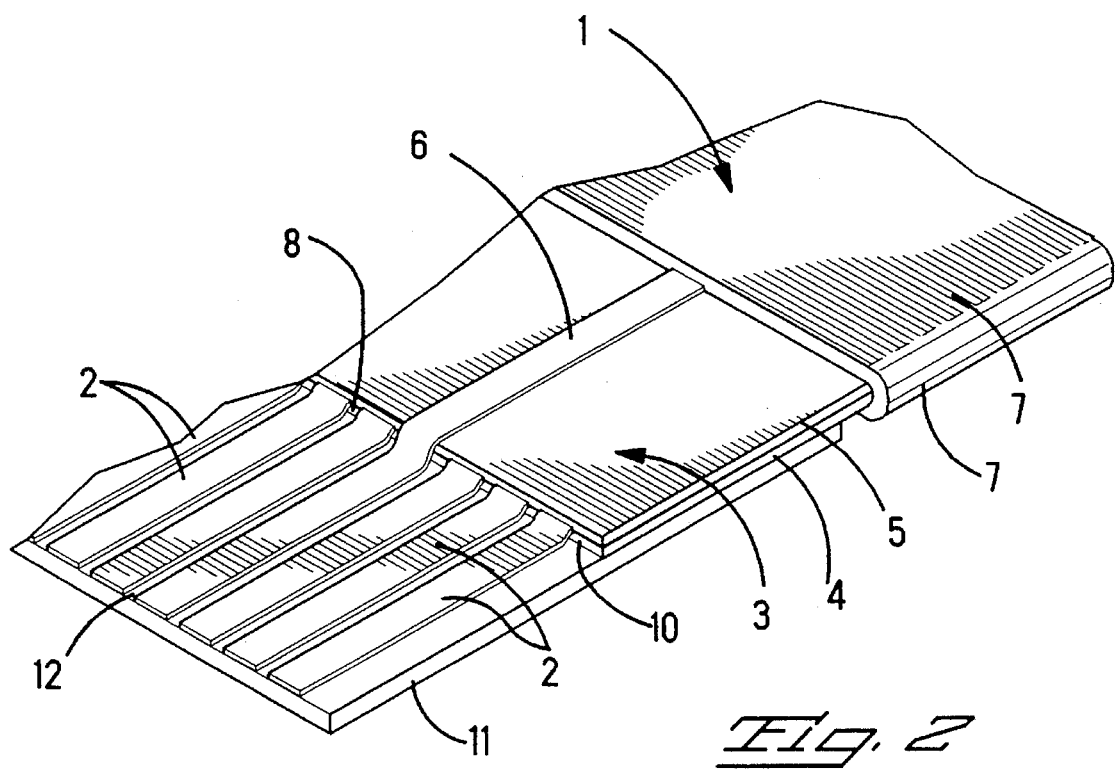
FIG. 2 is a view similar to FIG. 1 and enlarged.
Figure 4:
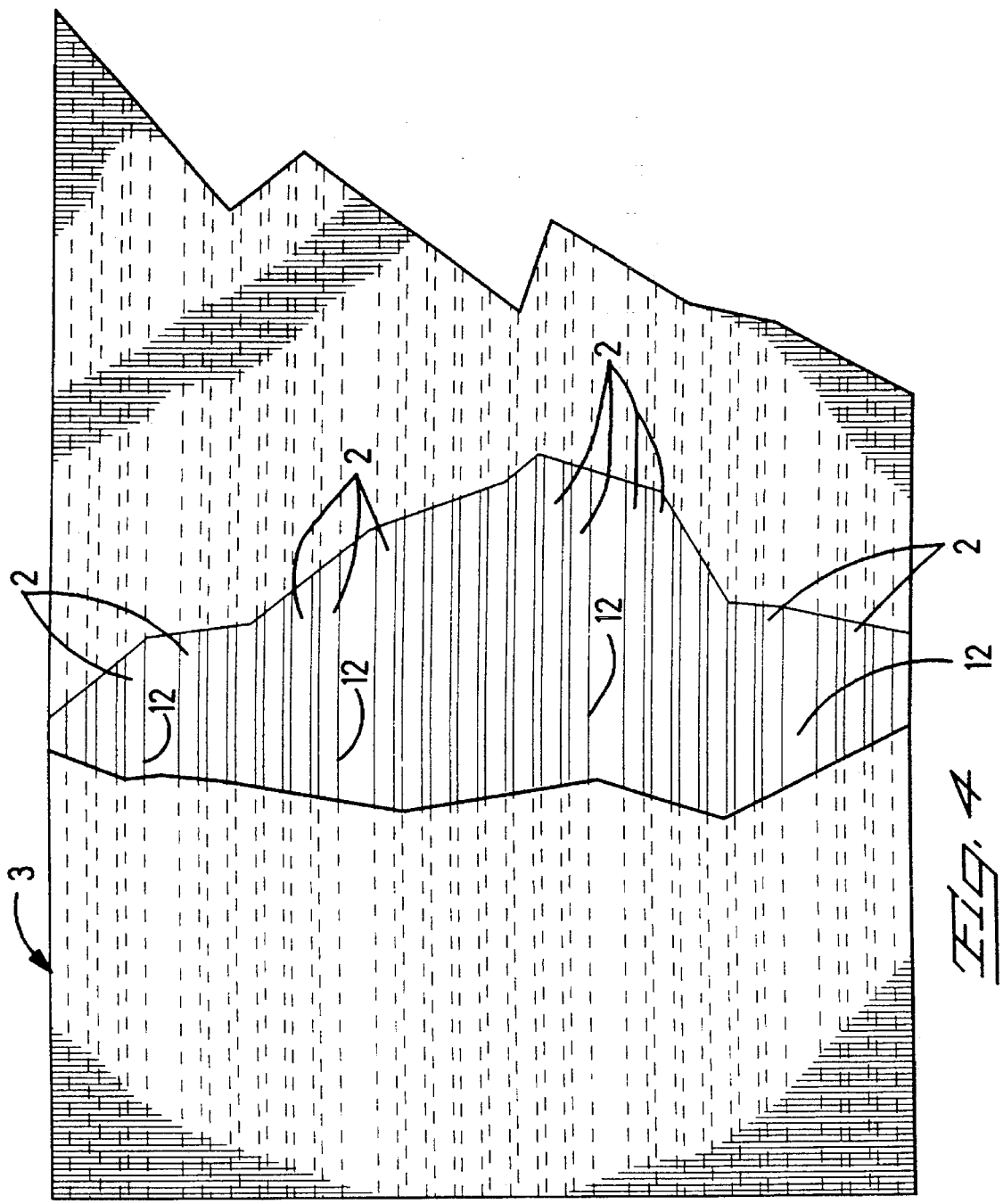
FIG. 4 is a fragmentary top view of the connection of FIG. 1 during one stage of construction, with parts cut away.
Figure 3:
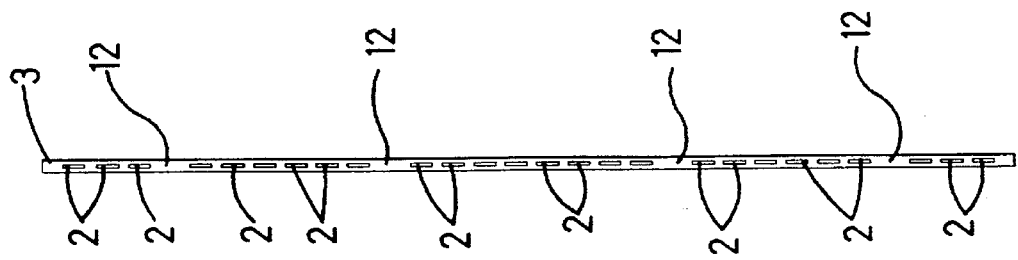
FIG. 3 is an end view of a portion of the connection shown in FIG. 4.

With reference to FIGS. 1, 2 and 6, a jumper connection 1 comprises, multiple, flexible and flat signal conductors 2 extending along a flexible ribbon of insulation 3. For example, the signal conductors 2 are illustrated as being flat and rectangular. With reference to FIGS. 2 and 3, the signal conductors 2 are imbedded in the insulation 3 that is of unitary construction, FIG. 3, or is a composite of two thin layers 4, 5, FIG. 2. The two layers 4, 5 are bonded together by fusion melting or by an adhesive, not shown.

With reference to FIGS. 1, 2 and 6, at least one ground conductor 6 is laid over the insulation 3 on one broad side of the insulation 3. FIG. 6 shows additional ground conductors 6 laid over the insulation 3. The signal conductors 2 are coplanar within a first plane. The insulation 3 is in a second plane. Each said ground conductor 6 is in a third plane that is above and separated from the first and second planes. Each said ground conductor 6 is separated from the plane of the signal conductors 2. The signal conductors 2 are spaced apart on pitch spacings, meaning that the longitudinal axes of the signal conductors 2 extend along spaced apart, consecutive centerlines. However, the jumper connection 1 is constructed purposely with a signal conductor 2 being absent from at least one of the pitch spacings, and said at least one ground conductor 6 extends above said one of the pitch spacings. In place of each absent signal conductor 2 along one of the pitch spacings, a ground conductor 6 can be present to extend above said one of the pitch spacings. In FIG. 6, multiple ground conductors 6 extend above corresponding pitch spacings. It can be stated further, that the signal conductors 2 are spaced apart one from another by corresponding spaces 12, and each said ground conductor 6 overlies and extends above a corresponding space 12.

A flexible and flat conductive shield 7 comprises a laminate of a conductive adhesive and a flexible and flat insulating film on each broad side of the insulation 3. The film of the shield 7 is constructed as solely insulation, or is constructed as a laminate of insulation and a thin foil of conductive metal to which the conductive adhesive adheres. The shield 7 wraps around an exterior of the flexible ribbon of insulation 3, and is secured by the conductive adhesive being adhered to the flexible ribbon of insulation 3. Said insulation 3 separates the shield 7 from the signal conductors 2 extending along the insulation 3. The shield 7 is secured to, and electrically connected to, each said ground conductor 6 by the conductive adhesive adhering to each said ground conductor 6.

With reference to FIG. 6, the jumper connection 1 is constructed with at least one opening 8 through the shield 7 exposing the insulation 3 and each said ground conductor 6. Each said ground conductor 6 bridges across said at least one opening 8 without being secured to the insulation 3 exposed at said opening 8. Accordingly, each said ground conductor 6 is accessible at the opening 8 for electrical termination.

With reference to FIG. 7, the cable 1 is severed to provide cut ends 10 on the cable. The insulation 3 and the conductors 2 are severed at the cut ends 10. With reference to FIG. 9, each said ground conductor 6 can be bent away from the opening 8, revealing the insulation 3 having therein the signal conductors 2.

Figure 10:
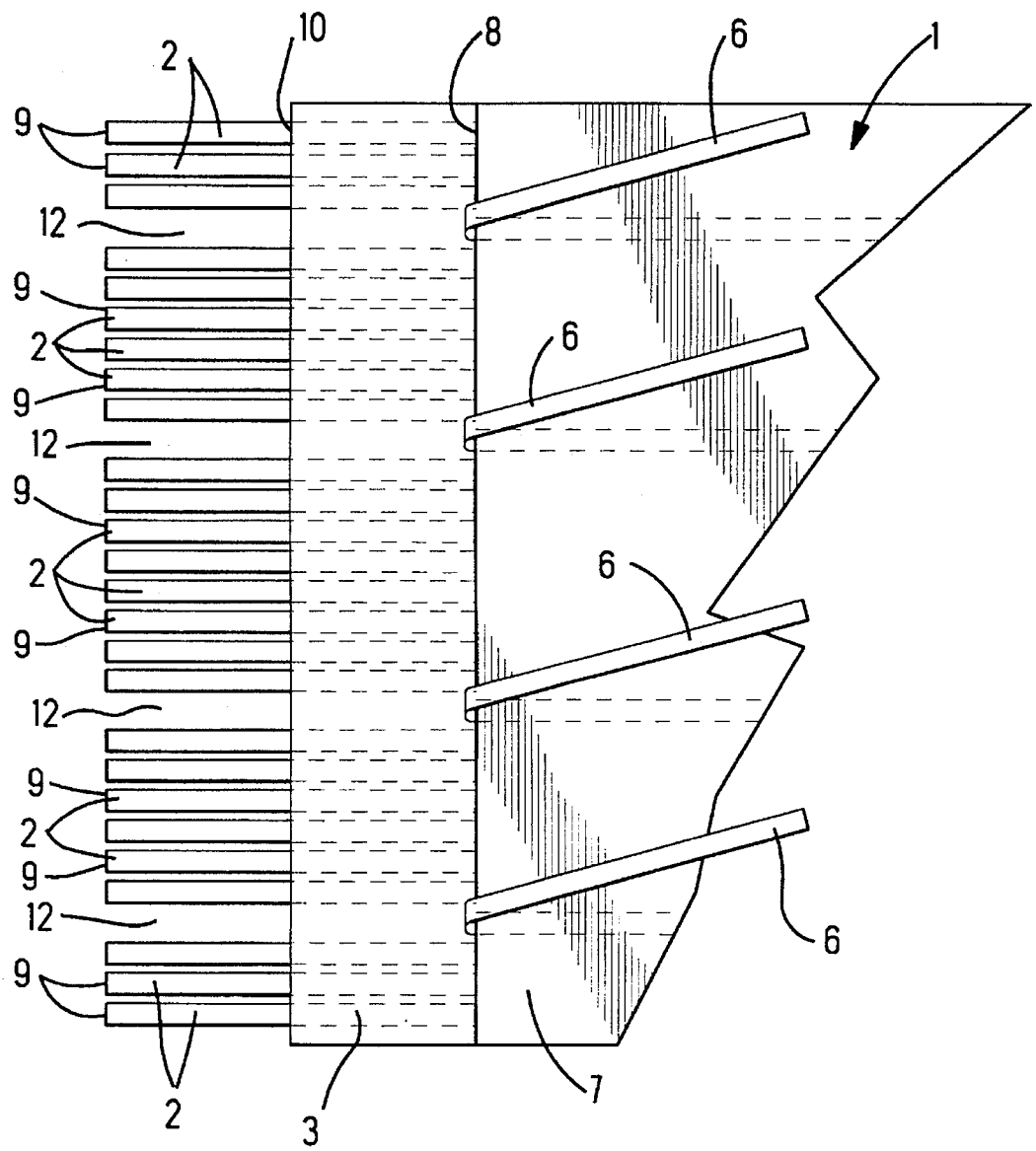
FIG. 10 is a top view of a portion of a connection.
Figure 11:
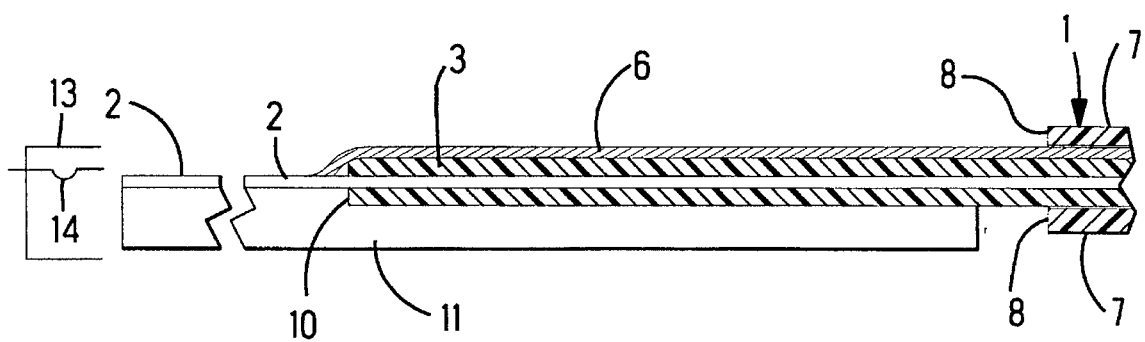
FIG. 11 is a side view of the connection shown in FIG. 2, with parts cut away, and with a conventional connector outline having conventional, correspondingly arranged conductors in the form of electrical contacts, shown in schematic manner.

With reference to FIG. 10, the insulation 3 can be cut away, revealing exposed and bared ends 9 of the signal conductors 2. The conductors 2, 6 extend beyond the cut end 10 on the cut away insulation 3. The signal conductors 2 and each said ground conductor 6 project beyond the cut end 10 now soley on the insulation 3.

As shown in FIGS. 1 and 2, each said ground conductor 6 can be bent to extend into the plane of the signal conductors 2. Thereby, the signal conductors 2 and the ground conductors 6 can extend on pitch spacings in a common plane of the conductors 2. The conductors 2, 6 are laminated to a stiffener 11, for example, comprising a plate of insulation. The conductors 2, 6 are bared, and are ready for termination, for example, with electrical terminals as disclosed in U.S. Pat. No. 4,172,626. The stiffener 11 supports the conductors 2, 6 while the conductors 2, 6 frictionally engage the terminals. With reference to FIG. 12, the signal conductors 2 and each said ground conductor 6 extend to a common plane beyond said cut end 10 of the insulation 3, for use as an electrical connector for mating with a member such as a conventional connector 13 having correspondingly arranged conductors 14 in the form of electrical contacts, shown in schematic manner.

Although the signal conductors 2 are flexible, flat conductors, the signal conductors 2 can be round. The signal conductors 2 can also be insulated conductors, for example, insulated before being constructed into a jumper connection 1. Additionally the signal conductors 2 can be arranged in twisted pairs along corresponding pitch spacings. Although each ground conductor 6 is a flexible, flat conductor, the ground conductor 6 can be round.

I claim:

1. A connection on an end of an electrical cable, comprising: a flexible and flat conductive shield, a flexible ribbon of insulation separating the shield from multiple flexible signal conductors extending along the insulation, at least one flexible ground conductor between the insulation and the shield, the signal conductors and each said ground conductor extending to a common plane beyond said end of the insulation, and the signal conductors and each said ground conductor being laminated to a surface on a plate of insulation for use as an electrical connector for mating with a member having correspondingly arranged conductors.

2. A connection as recited in claim 1 wherein, the signal conductors are coplanar.

3. A connection as recited in claim 1 wherein, the signal conductors are spaced apart one from another by corresponding spaces, and each said ground conductor along an uncut portion of the cable overlies and extends along a corresponding space.

4. A connection as recited in claim 3 wherein, the shield is secured to each said ground conductor by conductive adhesive.

5. A connection as recited in claim 3 wherein, the shield is secured to said insulation by conductive adhesive.

6. A connection as recited in claim 3 wherein, the shield is secured to said insulation and each said ground conductor by conductive adhesive.

7. A connection as recited in claim 3 wherein, the signal conductors are imbedded within the insulation.

8. A connection as recited in claim 3 wherein, each said ground conductor is separated from the plane of the signal conductors.

9. A connection as recited in claim 1, and further comprising: at least one opening through the shield exposing the insulation and each said ground conductor.

10. A connection as recited in claim 9 wherein, each said ground conductor bridges across said at least one opening without being secured to the insulation exposed at said opening.

11. A connection as recited in claim 1 wherein, the shield wraps around an exterior of the insulation.

* * * * *